United States Patent [19]
Shibib

[11] Patent Number: 5,395,776
[45] Date of Patent: Mar. 7, 1995

[54] METHOD OF MAKING A RUGGED DMOS DEVICE

[75] Inventor: Muhammed A. Shibib, Wyomissing Hills, Pa.

[73] Assignee: AT&T Corp., Murray Hill, N.J.

[21] Appl. No.: 61,143

[22] Filed: May 12, 1993

[51] Int. Cl.[6] .......................................... H01L 21/335
[52] U.S. Cl. ........................................ 437/40; 437/41; 437/51; 437/154
[58] Field of Search .................... 437/29, 40, 41, 44, 437/154, 51; 148/DIG. 126; 257/335

[56] References Cited
U.S. PATENT DOCUMENTS

| | | |
|---|---|---|
| 4,072,975 | 2/1978 | Ishitani . |
| 4,443,931 | 4/1984 | Baliga et al. . |
| 4,631,564 | 12/1986 | Neilson et al. ........................ 257/341 |
| 4,639,762 | 1/1987 | Neilson et al. ........................ 257/142 |
| 4,644,637 | 2/1987 | Temple ................................. 437/41 |
| 4,680,853 | 7/1987 | Lidow et al. . |
| 4,930,792 | 2/1984 | Temple . |
| 5,156,989 | 10/1992 | Williams et al. ...................... 437/41 |
| 5,283,202 | 2/1994 | Pike, Jr. et al. ....................... 437/31 |

*Primary Examiner*—T. N. Quach
*Attorney, Agent, or Firm*—Scott W. McLellan

[57] ABSTRACT

A method of making a doubly-diffused MOS (DMOS) device that can tolerate higher drain dV/dt before latch-up occurs. At least some of the immediately adjacent multiple body regions in the DMOS device are interconnected at the corners thereof by the formation of P-conductivity regions. These regions reduce parasitic bipolar effects and facilitate collection of excess carriers in the device that causes latch-up under high dV/dt conditions and reduced avalanche energy tolerance.

9 Claims, 3 Drawing Sheets

METHOD OF MAKING A RUGGED DMOS DEVICE

BACKGROUND OF THE INVENTION

CROSS-REFERENCE TO RELATED APPLICATION

This application is related to a co-pending patent application titled "DMOS Structure with Less Susceptibility to Latch-Up", by M. A. Shibib, Ser. No. 08/061,136, filed simultaneously with, and assigned to the same assignee, as this application.

1. Field of the Invention

This invention relates to metal-oxide-semiconductor devices in general and, more particularly, to a method of making doubly-diffused metal-oxide-semiconductor devices.

2. Description of the Prior Art

Conventional doubly-diffused metal-oxide-semiconductor (DMOS) devices may suffer from a parasitic bipolar transistor that can break down and destroy the DMOS device. Typically, the parasitic bipolar transistor has a lower breakdown voltage, when made conductive, than the DMOS device can withstand with the parasitic bipolar transistor turned off.

For example in FIG. 1, a simplified cross-section of a portion of N-channel DMOS transistor is shown. The DMOS transistor is shown having a source, a drain and a gate, the channel for the transistor being formed between the N+ type region and the N type drain when the surface of the P type layer is inverted by a suitable voltage on the gate. The parasitic NPN bipolar transistor is shown schematically having an emitter and collector in common with the source and drain of the DMOS transistor, respectively. The base of the bipolar transistor is formed by the P layer. When excess carriers in the bulk (N type drain region) of the device are swept into the junction of the N+ and P type layers (the emitter-base region of the parasitic bipolar transistor), the parasitic bipolar transistor can be forward biased. This typically happens when the drain voltage of the DMOS device is too rapidly changed. For example, when switching highly inductive loads, the drain voltage can change at several hundred volts per microsecond, causing the parasitic bipolar transistor to conduct and, if precautions are not taken, may destroy the DMOS transistor. This may also happen if carriers are generated by an avalanche breakdown of the N-type drain/P-type layer junction.

The above may also apply generally to other MOS controlled transistors, such as insulated gate bipolar transistors (IGBTs).

Thus, it is desirable to provide a DMOS (or IGBT) device that has less susceptibility to damage from fast drain (collector) voltage transients and avalanche breakdown.

Further, it is desirable to provide a DMOS (or IGBT) device with a higher avalanche energy tolerance for a given drain (collector) breakdown voltage or transient current.

SUMMARY OF THE INVENTION

These and other aspects of the invention may be obtained by a method of making an MOS controlled transistor. The transistor has a substrate of a first conductivity type with a major surface, a plurality of laterally displaced first regions of a second conductivity type extending from the major surface of the substrate to a first depth, and a second region of the first conductivity type within each of the first regions and extending from the major surface of the substrate to a depth less than the first depth. The method of making the transistor is characterized by the step of forming third regions of the second conductivity type in the substrate and in contact with the first regions. The third regions interconnect the first regions.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
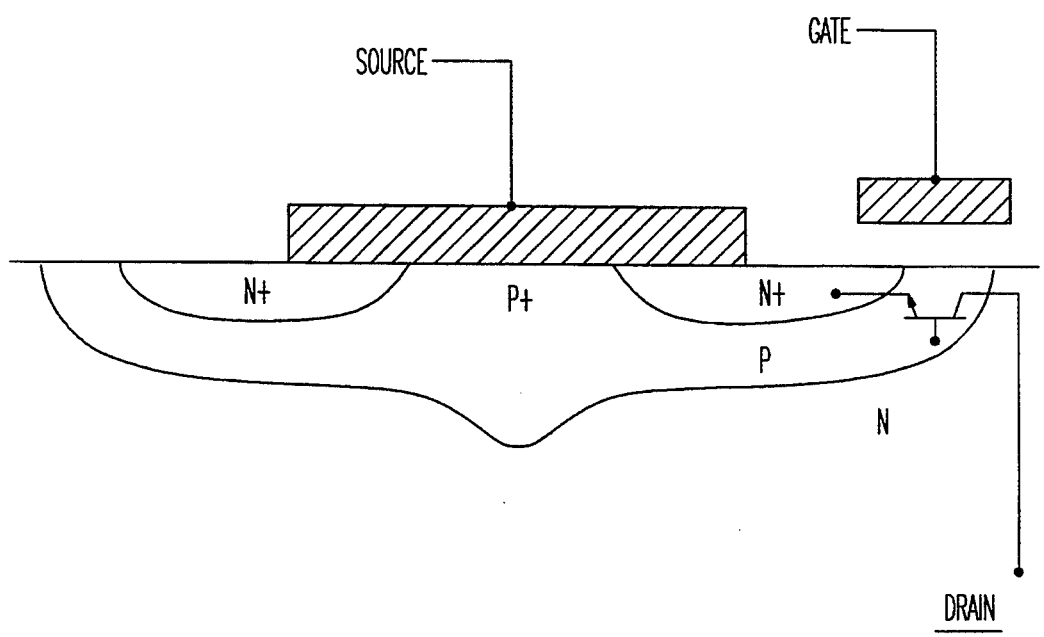
FIG. 1 is a simplified cross-sectional diagram of an exemplary DMOS transistor showing a parasitic bipolar transistor.
Figure 2:
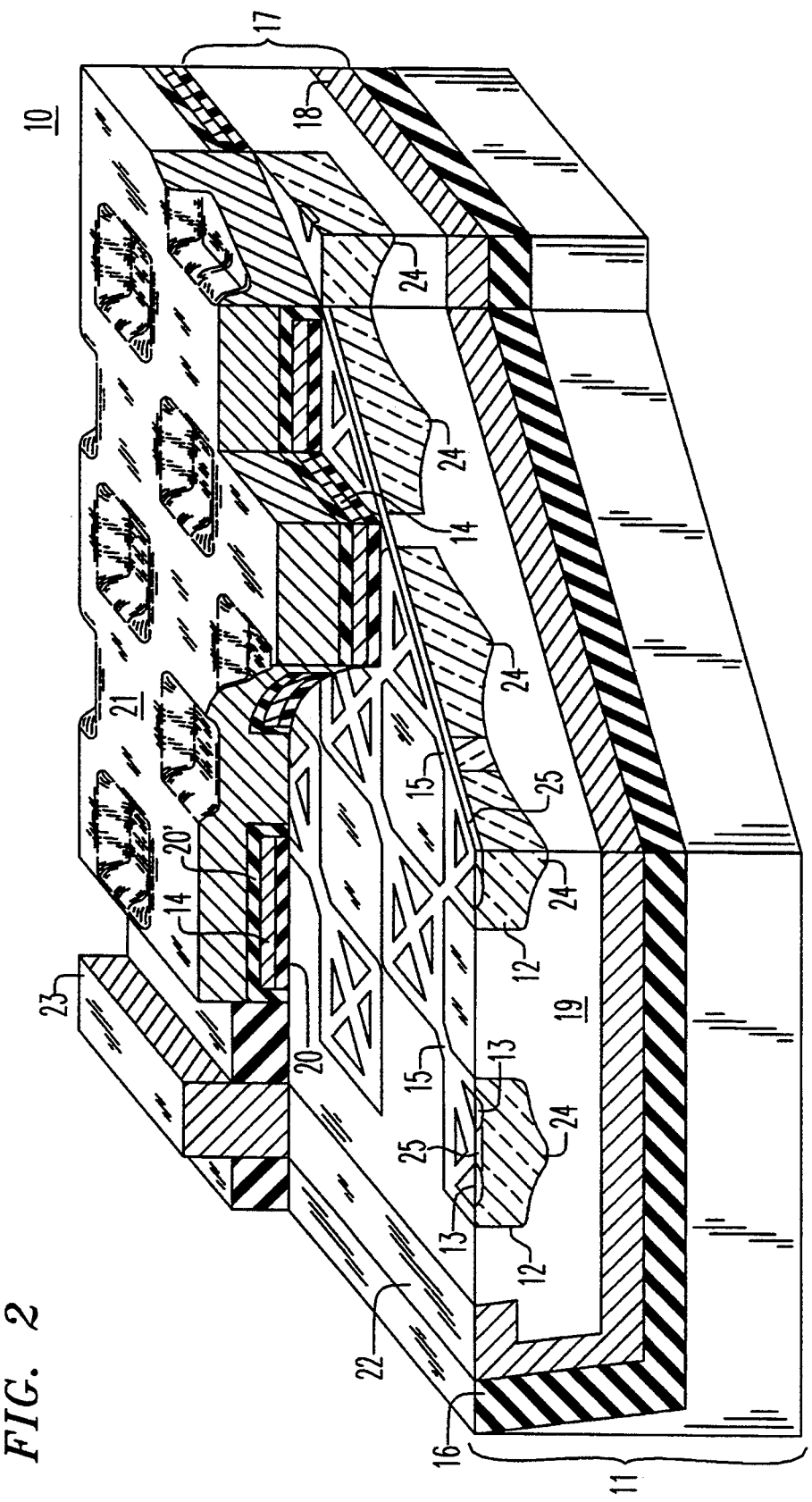
FIG. 2 is a simplified cross-sectional diagram of one exemplary embodiment of the invention.

The invention may be understood generally from FIG. 2, in which an MOS controlled transistor 10 has a substrate 11 of a first conductivity type with a major (top) surface, a plurality of laterally displaced, spaced apart, first regions 12 of a second conductivity type extending from the major surface of the substrate 11 to a first depth, a second region 13 of the first conductivity type within each of the first regions 12 and extending from the major surface of the substrate 11 to a depth less than the first depth, and a conductive gate layer 14 overlaying the major surface of the substrate between the first regions. The transistor 10 has formed therein third regions 15, of the second conductivity type disposed in the substrate 11, interconnecting the first regions 12.

In more detail, the transistor 10 is shown here embodied in a substrate 11 using a oxide layer 16 to dielectrically isolate a pocket of silicon material 17 from the bulk substrate 11. It is not necessary that the transistor 10 utilize dielectric isolation; dielectric isolation may be useful for integrated circuit fabrication using the transistor 10 therein. The pocket of material 17 may have a wide resistivity range with a low resistivity buried layer 18 to assist in forming a low resistance contact to the remainder of the material 17. The portion of layer 17 above the buried layer 18 is referred to herein as a common drain layer 19, the purpose of which will be discussed below.

Into a major surface (top) of the layer 19 there is formed a plurality of regions 12, herein referred to as the body region 12, having an opposite conductivity type than that of the layer 19. Into the body regions 12 smaller regions 13 are formed. Regions 13 are the same conductivity type as that of layer 19. In the approximate center of the body regions 12 is a deeper portions 24 having the same conductivity type as the body regions 12. The resistivity of the deep regions 24 is less than the resistivity of the body regions 12 and the resistivity of regions 13 is less than both. The depth of the body regions 12 below the surface of layer 19 is greater than the depth of the regions 13 and, preferably, the depth of the body region 12 at the approximate center thereof is greater than at the periphery. The combination of regions 12 and 13 form the "source" or "emitter" for the transistor 10, as will be discussed below.

Interconnecting the body regions 12 are regions 15 having the same conductivity type as the body regions 12, the purpose of which is discussed in more detail below. The result is an interconnected grid of body regions 12 with "open" areas of layer 19 at the surface thereof between the body regions 12. Preferably, the regions 15 are made simultaneously with the formation of body regions 12.

Also at the center of the body regions 12, and extending along the surface of regions 12 and 15, are low resistivity layer 25. Layer 25 assists in making a low resistance contact between metal layer 21 (discussed below) and the body region 12 reduces the resistance along regions 15 between body regions 12. The resistivity of the layer 25 is preferably less than the bulk resistance of regions 12 and 15 and have the same conductivity type as the body regions 12 and 15. It is understood that layer 25 is not absolutely necessary and may be removed from regions 12 and/or regions 15.

Overlaying the surface of the layer 19 is a grid of interconnected polysilicon runners 14 forming the gate of the transistor 10. Each of the runners 14 is encased in an insulator, a gate oxide layer 20 and a second later formed insulative layer 20'. The insulators 20, 20' serve to insulate the runners 14 from surrounding conductive material. The runners 14 and oxide layers 20, 20' are disposed over the surface of layer 19 in a manner that leaves the regions 12 and 13 "exposed" for later contact, as discussed below. Preferably, the runners 14 are one layer of low resistivity (highly doped) polysilicon with openings therein to expose the regions 12 and 13.

It is noted that for the polysilicon runners 14 to be interconnected, there should be places where the polysilicon runners 14 couple to each other. This typically takes place at the corners so that the underlying region 15 may not be formed, as illustrated in FIG. 2 by the regions 15 not being at every corner of regions 12. The reasons therefore will become more apparent in connection with the discussion about exemplary fabrication process steps discussed below.

A metal layer 21 overlays the polysilicon runners 14 to make contact to the regions 12 and 13 across the transistor 10. The metal layer 21 serves as the "source" or "emitter" contact to the transistor 10. Note that both the regions 12 and 13 are connected (shorted) together by the metal layer 21.

Metal runner 23 makes contact with buried layer 18 via contact layer 22 to form the "drain" or "collector" contact for the transistor 10. If the conductivity type of the buried layer 18 is the same as the layer 19, the transistor 10 is a DMOS transistor. If, however, the conductivity of the buried layer 18 is opposite the conductivity type of the layer 19, the transistor 10 is a insulated gate bipolar transistor (IGBT). In either case, the transistor 10 is an MOS controlled transistor.

To reduce parasitic bipolar effects discussed above, the regions 15 interconnect the body regions 12 to reduce the gain of the parasitic bipolar transistor by shorting together the body regions 12 and facilitating the collection of excess carriers from the layer 19 that would otherwise lead to the forward biasing of the parasitic transistor(s) in the transistor 10.

Figure 3:
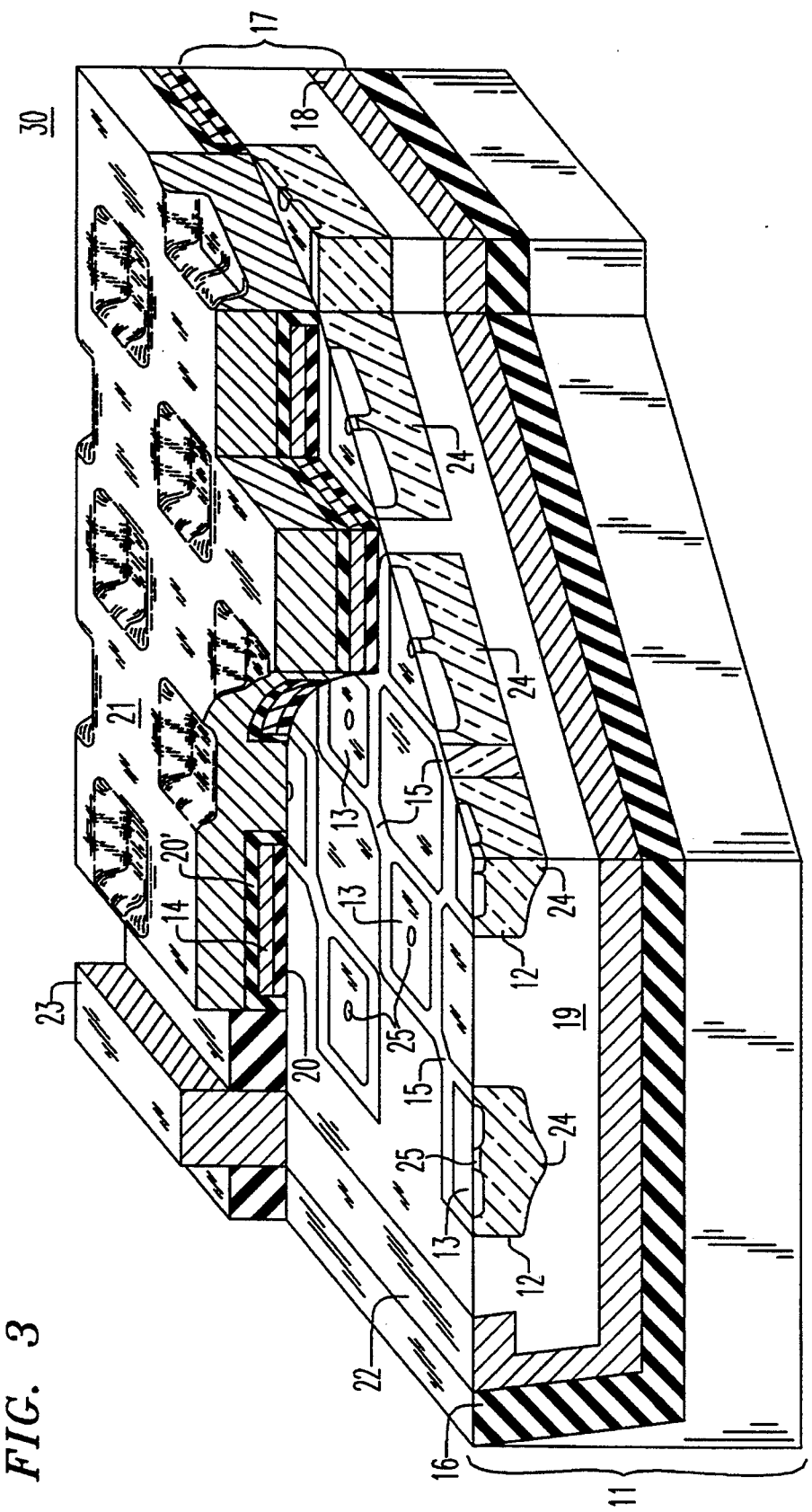
FIG. 3 is simplified cross-sectional diagram of a second exemplary embodiment of the invention.

An alternative embodiment of the invention is shown in FIG. 3. The transistor 30 is similar to the transistor 10 shown in FIG. 2, except for the structure of base regions 12, regions 13, low resistivity layers 25 and the deep regions 24. More particularly, the deep regions 24 substantially make up the connecting regions 15 and couple together the body regions 12. Layers 25, now more like regions than layers, are limited to the approximate center of the surface of body regions 12 and do not need to extend along the surface of regions 12 and 15. Opposite conductivity regions 13 surround the corresponding regions (layers) 25 and is set wholly within the body regions 12. Thus, the channels for the transistor 30, discussed above, are formed between the regions 13 and the common layer 19 across the surface of body regions 12. It is noted that the depth of the deep region 24 is greater or equal to the depth of the body region 12 and, as discussed above, the resistivity of the deep regions 24 is less than that of the body regions 12 and the resistivity of the regions 13 are lower than both.

Exemplary Fabrication Steps

In more detail, the transistor 10 of FIG. 2 is fabricated by the following exemplary process. Starting with a substrate 11 having a layer 17 of first conductivity type silicon (e.g., N type) with a buried layer 18, the surface of layer 17 has deposited thereon a photoresist (not shown) which is patterned and a contact region 22 connected to the buried layer 18 is first formed, for example, by implanting a dopant having the same conductivity type as that in the buried layer 18. The buried layer 22 and contact layer 22 may be, for example, N type for a DMOS transistor 10 or P type for an IGBT.

The photoresist is removed and another photoresist is deposited and patterned to make opening in which the deep regions 24 are formed by implanting a P type dopant. The photoresist is removed and a thin oxide layer 20 is grown on layer 17, the thickness of which is the desired gate oxide thickness of the transistor 10. Next, a layer of polysilicon is deposited onto the oxide layer 20 and is doped to have a low resistance. The polysilicon is patterned to make the grid-like gate structure 14 with openings therein to expose the surface layer 19. As noted above, the grid of the gate layer 14 will not be a "complete" or "continuous" grid; interconnections within the grid are removed at various places so that region 15 may be formed, as discussed below.

Using the polysilicon as a mask, the body regions 12 are formed by implanting a P dopant into the layer 19. With sufficient drive-in (for example, 200 minutes at 1200° C.), the typical depth of the body regions 12 extends to about an exemplary four microns from the surface of the layer 19. For the deep region 24, the typical depth extends up to about an exemplary six microns. Next, photoresist is deposited and patterned to expose the surface of the substrate 11 where the shallow, low resistivity, layers 25 are to be formed by a heavy implant of a P type dopant.

The photoresist is then removed and another photoresist deposited and patterned to expose the surface of layer 19 within the body regions 12 to form the regions 13 by heavily implanting an N-type dopant. The openings in the photoresist are such that the formed regions 13 do not significantly encroach the channel portion of the body regions 12, as discussed above. The photoresist is then removed.

Next, a passivation layer 20' of silicon dioxide, P-glass or borophosphosilicate glass (BPG) is deposited and patterned to leave the layer over the polysilicon 14. Then the oxide layer 20 over the body regions 12 is removed and the metal layer 21 is deposited.

For the transistor 30 in FIG. 3, the above-described process is substantially similar. Differences in the process involves the implants which forms the body regions 12, deep regions 24 and the shallow, low resistivity, regions 25. For transistor 30, the body region implant is limited to forming the regions 12 and the deep region implant continues beyond regions 12 and forms the regions 15. The implant that forms regions 25 is now limited to the approximate center of the regions 12 for a low resistance contact between the metal 21 and the body regions 12. As is evident from FIG. 3, the regions 13 surround the regions 25 although this is not a requirement.

Exemplary Results

A DMOS transistor 10 has been formed in an substrate 11 using the following doping densities and sizes:
body region 12 P-type, 480 ohm/square
region 13 N-type, 20 ohm/square
layer 19 N-type, 4–50 ohm-cm.
deep region 24 P-type, 80 ohm/square
shallow region 25 P-type, 80 ohm/square Using substantially identical DMOS transistors 10 but one with regions 15 and one without, each driving inductive loads, the device with regions 15 is much more rugged than an equivalent device without the regions 15. The test was made using an industry-standard measurement for the amount of energy (avalanche energy) dissipated in a test transistor when switching an inductive load. Avalanche energy is often referred to as the product of the breakdown voltage of the device and the total charge applied to it. For purposes here, total charge is defined as the product of the current into the device at breakdown (avalanche) and the time the current is applied for a nearly "square" pulse of current. As measured, the DMOS transistor with regions 15 required approximately ten times the avalanche energy before destruction the transistor than the transistor without the regions 15. It has also been found that the latching current for an IGBT is similarly increased when regions 15 are added to a conventional IGBT structure.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. A method of making an MOS controlled transistor having:
    a substrate of a first conductivity type with a major surface;
    a plurality of laterally displaced, spaced apart, first regions of a second conductivity type extending from the major surface of the substrate to a first depth;
    a second region of the first conductivity type within each of the first regions and extending from the major surface of the substrate to a depth less than the first depth;
CHARACTERIZED BY THE STEP OF:
    forming third regions of the second conductivity type in the substrate and in contact with the first regions, for interconnecting immediately adjacent first regions.

2. The method of making a transistor as recited in claim 1, wherein the first regions are disposed in rows and columns.

3. The method of making a transistor as recited in claim 2, further characterized by the steps of:
    depositing metal conductors to contact the first and second regions;
    wherein the conductors interconnect the first and second regions to form a first terminal of the transistor.

4. The method of making a transistor as recited in claim 3, wherein the resistivity of the third regions is less than the resistivity of the substrate.

5. The method of making a transistor as recited in claim 4, further characterized by the step of forming a fourth region of the first conductivity type, disposed in the substrate and displaced from the first regions, forming a second terminal of the transistor.

6. The method of making a transistor as recited in claim 4, further characterized by the step of forming a fourth region of the second conductivity type, disposed in the substrate and displaced from the first regions, forming a second terminal of the transistor.

7. A method of making an MOS controlled transistor having:
    a substrate of a first conductivity type with a major surface;
CHARACTERIZED BY THE STEPS OF:
    forming a plurality of laterally displaced, spaced apart, first regions of a second conductivity type extending from the major surface of the substrate to a first depth;
    forming a second region of the first conductivity type within each of the first regions and extending from the major surface of the substrate to a depth less than the first depth; and
    forming third regions of the second conductivity type in the substrate and in contact with the first regions, for interconnecting immediately adjacent first regions; and
    depositing metal conductors to contact the first and second regions;
    wherein the third regions have a resistivity less than the substrate resistivity, the first regions are disposed in rows and columns, and the conductors interconnect the first and second regions to form a first terminal of the transistor.

8. The method of making a transistor as recited in claim 7, further characterized by the step of forming a fourth region of the first conductivity type, disposed in the substrate and displaced from the first regions, forming a second terminal of the transistor.

9. The method of making a transistor as recited in claim 7, further characterized by the step of forming a fourth region of the second conductivity type, disposed in the substrate and displaced from the first regions, forming a second terminal of the transistor.

* * * * *